US009568525B2

United States Patent
Reus

(10) Patent No.: US 9,568,525 B2
(45) Date of Patent: Feb. 14, 2017

(54) ARRANGEMENT AND METHOD FOR CAPACITIVE SENSING OF THE ROTARY MOVEMENT OF A ROTARY ELEMENT

(75) Inventor: Jürgen Reus, Freigericht (DE)

(73) Assignee: Techem Energy Services GmbH, Eschborn (DE)

( * ) Notice: Subject to any disclaimer, the term of this patent is extended or adjusted under 35 U.S.C. 154(b) by 308 days.

(21) Appl. No.: 13/983,755

(22) PCT Filed: Jan. 13, 2012

(86) PCT No.: PCT/EP2012/050504
§ 371 (c)(1),
(2), (4) Date: Mar. 4, 2014

(87) PCT Pub. No.: WO2012/130485
PCT Pub. Date: Oct. 4, 2012

(65) Prior Publication Data
US 2014/0176162 A1    Jun. 26, 2014

(30) Foreign Application Priority Data

Mar. 30, 2011    (DE) ........................ 10 2011 015 589

(51) Int. Cl.
*G01R 27/26* (2006.01)
*G01D 5/241* (2006.01)
*G01P 3/483* (2006.01)

(52) U.S. Cl.
CPC ......... *G01R 27/2605* (2013.01); *G01D 5/2412* (2013.01); *G01P 3/483* (2013.01)

(58) Field of Classification Search
CPC .... G01R 27/2605; G01P 3/483; G01D 5/2412
(Continued)

(56) References Cited

U.S. PATENT DOCUMENTS 3,732,553 A * 5/1973 Hardway, Jr. ........ G01D 5/2412
340/870.37
4,347,478 A * 8/1982 Heerens ................... G01B 7/08
324/611
(Continued)

FOREIGN PATENT DOCUMENTS

DE    EP 1785732 A1 * 5/2007 .............. G01P 3/483
EP    0459118 A1    12/1991
(Continued)

OTHER PUBLICATIONS

Form PCT/IB/338, Notification of Transmittal of Translation of the International Preliminary Report on Patentability.

*Primary Examiner* — Jermele M Hollington
*Assistant Examiner* — Khristopher Yodichkas
(74) *Attorney, Agent, or Firm* — McDonnell Boehnen Hulbert & Berghoff LLP

(57) ABSTRACT

A configuration and a method for capacitive sensing of the rotatory motion of a rotary member are described. The configuration has four electrodes located in one plane, an analysis unit connected to the electrodes and an electrically conducting coupling surface, which is located at the rotary member opposite to the electrodes. The electrodes comprise a central excitation electrode, surrounded by the other electrodes. The coupling surface is opposite to the surface of the excitation electrode in each rotary position and covers a part of the surface formed by the remaining electrodes and passes over the surface formed by the remaining electrodes during a rotation of the rotary member. The remaining electrodes are formed by two sensor electrodes and a joint reference electrode, whereby at least the joint reference electrode is designed different than the sensor electrodes.

13 Claims, 5 Drawing Sheets

(58) Field of Classification Search
USPC .............................. 361/298.1; 324/658–690
See application file for complete search history.

(56) References Cited

U.S. PATENT DOCUMENTS

| | | | | |
|---|---|---|---|---|
| 4,520,325 | A * | 5/1985 | Hoffman | G01D 5/2412 |
| | | | | 324/725 |
| 5,077,635 | A | 12/1991 | Bollhagen et al. | |
| 5,537,109 | A * | 7/1996 | Dowd | G01D 5/2412 |
| | | | | 324/658 |
| 5,910,781 | A * | 6/1999 | Kawamoto | G01D 5/2405 |
| | | | | 318/662 |
| 6,170,162 | B1 * | 1/2001 | Jacobsen | G01D 5/2415 |
| | | | | 33/1 PT |
| 6,876,209 | B2 * | 4/2005 | Lin | G01D 5/2405 |
| | | | | 324/207.14 |
| 2010/0045245 | A1 * | 2/2010 | Hawley | H02M 3/1582 |
| | | | | 323/222 |

FOREIGN PATENT DOCUMENTS

| | | |
|---|---|---|
| EP | 1033587 A2 | 9/2000 |
| EP | 1785732 A1 | 5/2007 |

* cited by examiner

DIFF 1 < S
DIFF 2 > S

DIFF 1 < S
DIFF 2 < S

DIFF 1 > S
DIFF 2 < S

DIFF 1 > S
DIFF 2 > S

ARRANGEMENT AND METHOD FOR CAPACITIVE SENSING OF THE ROTARY MOVEMENT OF A ROTARY ELEMENT

CROSS REFERENCE TO RELATED APPLICATIONS

The present application is a 35 U.S.C. 371 National Application of PCT/EP2012/050504 filed Jan. 13, 2012, which claims priority to German Patent Application No. 10 2011 015 589.9, filed Mar. 30, 2011, the entire contents of which are incorporated entirely herein by reference.

BACKGROUND

The invention relates to a configuration and a method for capacitative sensing of the rotary motion of a rotary member, whereby the configuration has four electrodes located in one plane, an analysis unit connected to the electrodes and an electrically conducting coupling surface. The coupling surface is mounted at the rotary member, opposite to the electrodes, and is used for the capacitive coupling of the electrodes.

The electrodes include a central excitation electrode which is surrounded by the other electrodes, whereby in every position of rotation, the coupling surface is opposite to the surface of the excitation electrode and substantially covers such. Further, the coupling surface covers a portion of the surface formed by the remaining electrodes and during a rotation of the rotary member it sweeps over various sections of the surface formed by the remaining electrodes. As a result, in every position of rotation of the coupling surface, a capacitor with identical effect is formed between the excitation electrode and the electrically conducting coupling surface, on which the electric charge distributes after the excitation electrode is coupled in. This electric charge that is distributed over the coupling surface is transmitted to the electrodes surrounding the excitation electrode opposite to the coupling surface, depending on the position of rotation. As a result, a capacitor is formed between the electrodes that are opposite to the coupling surface in a certain rotatory position of the coupling surface. Electrons are induced that can be identified by a voltage signal at the electrodes.

To be able to identify the rotary position of the rotary member relative to the coupling surface time-resolved, the analysis unit has an excitation circuit connected to the excitation electrode for generating excitation pulses having a specified frequency (frequency circuit) and an analysis circuit connected to the remaining electrodes to detect the voltage signals applied to the electrodes and to compare these voltage signals.

These types of configurations for capacitive sensing are frequently used in supply meters, in particular, water flow meters, but also for voltage or gas meters in which the consumption of the consumed medium is transformed into a rotatory motion by a sampling element. This rotatory motion is then transmitted to the rotary member of the configuration by a coupling, a transmission and/or a spindle, to which the coupling surface is mounted.

In a water flow meter, an impeller wheel is most often used to capture the flow rate. The rotatory motion of the impeller wheel in the flow rate measuring device is a measure for the volume stream and can be detected by electrical properties of the rotary member in the configuration according to the invention. This is accomplished by a half-sided electrically conducting metal coating of the rotary element, which is an especially suitable coupling surface and couples capacitative with the electrodes of the sensor configuration, which are fixed.

An example for such a capacitative sensing process is described in EP 1 785 732 A1, which shows a configuration for detecting a rotation of a rotary member with an electrically conducting partial surface provided in an essentially planar surface of the rotary member and with a fixed sensor element having an excitation electrode and at least two receiving electrodes adjacent to the excitation electrode. The electrodes are opposite to the electrically conducting partial surface at a distance and can be coupled capacitative with the excitation electrode upon rotating the rotary member over the electrically conducting partial surface.

The detection tools provided in the configuration include a voltage tool for charging the excitation electrode with a voltage pulse that has a voltage greater than the voltage made available by the battery providing the operating voltage of the configuration, as well as an evaluation tool for picking up receiver signals of at least two receiver electrodes that are generated as a result of capacitive coupling because of the voltage pulse. Further, a comparison tool for generating a signal indicating the position of the partial surface relative to the receiver electrodes is provided. As a result of the intensity of the voltage pulse with which the excitation electrode is charged, interference effects from external electrical fields or field oscillations can be reduced. This makes it possible to dispense with the corresponding electronics in a capacitor electrode that is described in a similar configuration according to EP 1 033 578 81.

According to the teaching of EP 1 785 732 A1, two different positions of the rotary member can be detected with two electrodes. To be able to detect the direction of rotation, however, four different positions of the rotary member must be identified. For this, four receiver electrodes are required.

The detection of the voltage signals of these four electrodes requires a higher degree of complexity of the electronics and a comparably large installation space for the electrodes and the connection lines leading to the evaluation electronics. But precisely this installation space is often not available when using the configuration according to the invention in a supply meter, because the installation space in supply meters is limited.

BRIEF SUMMARY

It is therefore the objective of the present invention to propose an advantageous possibility for the capacitative sensing of a rotatory motion of a rotary member in which the complexity for the evaluation is reduced and the installation space for the overall electrode configuration can be designed particularly small.

According to the invention, this problem is solved by a configuration of the type cited at the beginning in such a way, that the remaining electrodes surrounding the excitation electrode are formed by two sensor electrodes and a joint reference electrode, whereby at last the joint reference electrode is designed distinct from the sensor electrodes. Further, the evaluation circuit is designed in such a way that respectively a difference of the voltage signal is formed between one of the two sensor electrodes and the joint reference electrode. Thus, two difference signals are formed between the first of the two sensor electrodes and the joint reference electrode, as well as between the second of the two sensor electrodes and the joint reference electrode.

In contrast to prior art, only three electrode signals must be evaluated in the present invention, which are summarized into two difference signals. This simplifies the circuit and makes it possible to utilize the available installation space for fewer electrodes which in this way—in spite of a reduced need for space—can still have a larger electrode surface and as a result, achieve a larger capacitative coupling with the enlarged voltage signals. Overall, this reduces the susceptibility to interference of the configuration and the required installation space is smaller.

By designing the joint reference electrode distinct from the sensor electrodes, the difference signals generated according to the invention result in two phase-shifted signals from which the direction of rotation of the rotary member can be derived. The design of the reference electrode distinct from the sensor electrodes has the particular effect of an asymmetric configuration, in which the angular field covered by the reference electrode relative to a central point of the excitation electrode that preferably coincides with the axis of rotation of the coupling surface is different from the angular field coverage of one sensor electrode, or from each of the sensor electrodes. Hereby, it is achieved that the phase-shift between the two signals is neither 0 nor 180° and thus a differentiation of the direction of rotation based on the asymmetry of the configuration is possible with the suitable dimensioning and positioning of the remaining electrodes around the excitation electrode.

To achieve a low level of susceptibility of the voltage signals of the sensor electrodes or the reference electrode, the pulse rate of the excitation pulse or the voltage pulse that is supplied to the excitation electrode is preferably approximately 30 to 35 V, i.e. it approximately corresponds to ten to fifteen times of the battery voltage of an operating battery of the configuration according to the invention, which is typically in the range of 3 V.

By refining the configuration according to the invention, the design and the location of the two sensor electrodes and the joint reference electrode can advantageously be optimized in such a way that the phase shift of the voltage signals from the first sensor electrode and the second sensor electrode, measured at the position of rotation of the coupling surface, is within a range of 90°, i.e., in particular, between 80° and 100°.

A preferred configuration for this provides that there is an axis of symmetry relative to the excitement electrode, the sensor electrodes and the reference electrode, relative to which the shape and the position of the aforementioned electrodes has a mirror image in the configuration. Preferably, the axis of symmetry runs through a central point of the excitement electrode, for example, the center of an excitement electrode that is designed annular or quadratic, whereby the axis of symmetry preferably also divides the reference electrode in mirror image and extends through an intermediate space between the two sensor electrodes. With such a configuration, a phase shift between the voltage signals of the two sensor electrodes in a range of 90° can be achieved easily.

An especially effective configuration lies therein, that the remaining electrodes essentially surround the excitation electrode circularly, whereby an intermediate space exists between the two sensor electrodes and between each sensor electrode and the reference electrode. The intermediate spaces between the individual electrodes can be of different sizes. Essentially circular means that each electrode surrounds the centrally located excitation electrode in a certain angular field and each electrode covers a different angular field. The basic form of one or of all remaining electrodes can be a segment of a circle without being limited to such according to the invention. To achieve the highest level of signal strength, it can further be provided according to the invention that the intermediate spaces between the electrodes have an overall angular field of less than 90° around the excitement electrode. Preferably, the angular field of all intermediate spaces collectively is between 50° and 80°. Then, the remaining angular field is available as electrode surface, by means of which, as a result of the capacitor configurations of the various electrodes a comparably large voltage signal can be generated with the coupling surface, which is less susceptible to external influences.

According to the invention it can further be advantageous when the distance between the two sensor electrodes is larger than the distance between one sensor electrode and the reference electrode, preferably by a factor of 3 to 6. Hereby, a significantly larger phase clearance between the two differences of the voltage signals of the one or the other sensor electrode and the reference electrode that is formed according to the invention is fostered. According to the invention, the desired phase clearance can also be suitably set, in particular, by the size of the intermediate spaces.

In a preferred embodiment of the configuration according to the invention, the reference electrode can be dimensioned in such a way that the coupling electrode covers—in a specific position of rotation of the rotary member—precisely the surface of the reference electrode, if applicable, with the adjacent intermediate spaces. In this position, the voltage signal is at its maximum at the reference electrode and the voltage signal at both sensor electrodes adjacent on each side of the reference electrode, is comparatively low. This kind of a configuration, also favors a suitable phase shift between the voltage signals from the one and the other sensor electrode in a range of 90°. Further, the sensor electrodes and the reference electrode can be dimensioned and positioned in such a way that the coupling surface covers at the most two or three of the remaining electrodes in each position of rotation of the rotary member, or is dimensioned and positioned in such a way that when the three remaining electrodes are covered in a position of rotation, at least one of the three electrodes has an angular field coverage that is <50°, preferably <30°. This leads to a particularly good decoupling of the various signals and thus to a particularly suitable phase shift between the voltage signals and the sensor electrodes.

A particularly preferred specific configuration according to the invention can be designed in such a way that the excitement electrode is circular the coupling surface is circular in an inner section, and in an inner section partially surrounding the outer section semicircular, and that the joint reference electrode covers an angular field of approximately 140° to 150°, and each sensor electrode covers an angular field of approximately 50° to 70°. Thereby, the dimension of the inner section of the coupling surface can essentially be straight, and except for a small deviation, correspond to the dimension of the excitement electrode. Hereby, in each position of rotation of the rotatory member, a good capacitative coupling of the excitement electrode to the coupling surface is achieved. Further, in this specific configuration, the angular field of the intermediate space between the two sensor electrodes can preferably be between 40° to 50°. In such a configuration, the coupling surface covers only the reference electrode in one position of rotation, if applicable, including the adjacent intermediate spaces.

According to an expedient embodiment of the configuration according to the invention, the evaluation circuit can have two comparators that respectively form a difference between the voltage signal of the one or the other sensor electrode and the voltage signal of the reference electrode, whereby one or each comparator emits an output signal only for a difference value that is above an adjustable threshold value either applicable to both, or individually adjustable. Hereby, for the two difference signals according to the invention, four independent states can be defined that respectively correspond to one position of rotation of the coupling surface relative to the electrodes. In the previously described optimized design and positioning of the electrodes, the rotary position of the coupling surface can thus be divided into four quadrants of 90° respectively, and thus also realize a reliable identification of the direction of rotation by evaluating the progression of the successively evaluated quadrants.

Preferably, the threshold value can be set in such a way that the threshold value is approximately in the middle between the maximum and the minimum difference value that is formed. This can also be accomplished by a suitable operating point displacement, for example, by connecting suitable voltage dividers, for the voltage signals of the sensor electrode and the reference electrode. Overall, the evaluation circuit can, for example, be realized by a microprocessor which captures and processes the analog voltage signals at the inlets, if applicable, after the operating point displacement. In particular, the two comparators can also be integrated into the microprocessor.

According to the invention, the excitement circuit for generating voltage pulses with a higher voltage than is provided overall by an operating battery of the configuration can have an electric circuit with an inductor connected to the battery, a switch and a unit to measure current (ammeter), whereby the excitement circuit is equipped to close the switch of the electric circuit for charging the inductor with a charge current, and open the switch again upon reaching a charge current threshold value for creating the voltage pulse. This process is repeated at the desired frequency for sensing the rotary position of the rotary member, for example, initiated by a suitable frequency generator. Preferably, the excitement circuit is simultaneously also equipped to measure the charging time between the closing of the switch and achieving the charge current threshold value to monitor manipulation.

Because the delay time of the charge current, i.e. the increase in a current delay diagram according to FIG. 6 depends on the inductor and the inductor is influenced by a permanent magnetic field that acts from the outside in such a way that the charge current threshold value is attained faster after the closing of the electric circuit with the switch, an externally applied magnetic field of this type can easily be identified for manipulation purposes, in particular, when using the configuration in a meter according to the invention, such as a water flow meter. Thus, with the previously described configuration, such an external magnetic field can be determined by a measurement of the charge time and a comparison with the previously captured standard value.

In the case of a manipulation by applying an external magnetic field, the metering of a conventional meter, in particular, a water flow meter can be influenced in such a way that no consumption is captured any more, or the consumption is at least not captured completely. The background is that meters often have a magnet coupling to connect a rotary member with the coupling surface to a member capturing the consumption. The magnetic field can influence this connection, which can perhaps lead to lower metering. Moreover, the intensity of the voltage pulse generated by the inductor decreases, among other things, because the total charge current is lower during the interval. This can have the consequence that the threshold values defined in the comparator are no longer reached, and no metering takes place at all. This type of manipulation can be reliably detected by measuring the charging time of the inductor according to the invention, without requiring any additional sensors or electronics. Therefore, the configuration according to the invention also solves the problem of detecting a manipulation by an external magnetic field reliably and technically easily. The time measurement can, for example, be easily converted in the microprocessor that is already present in the configuration.

In addition to the configuration, the invention also relates to a corresponding method for capacitative sensing of a rotary motion of a rotary member with a configuration consisting of a central excitation electrode and a reference electrode and two sensor electrodes, which surround the central excitation electrode, whereby the excitation electrode and the sensor electrodes are located in a plane and opposite to the coupling surface provided at the rotary member. The coupling surface covers the excitation electrode at least to a large extent, as well as, depending on the rotary position, parts of the remaining electrodes for capacitative coupling of the excitation electrode with the reference electrode and the two sensor electrodes depending on the rotary position. Thus, it is a method according to the invention, in particular, for capacitative sensing by the previously described configuration.

In the method, the excitation electrode is charged with a specified frequency with voltage or excitation pulses, whereby the resulting voltages of the reference electrode, the first sensor electrode and the second sensor electrode are measured. In order to achieve an identification of the direction of rotation with low space requirements by using a small number of electrodes, and without any major circuit complexity, it is proposed in accordance with the invention, that differences in voltage are formed by the one or the other sensor electrodes respectively with the reference electrode common to both sensor electrodes, and evaluated to determine the motion and the rotary position of the rotary member. The mechanism for this was already explained in the description of the configuration, so that it can serve as reference. The explanations pertaining to the configuration correspondingly apply to the method.

According to a preferred refinement of the method according to the invention, an output signal can be generated respectively in one comparator of an evaluation circuit for the difference in voltage of the sensor electrode and the reference electrode above a threshold value, and for a difference, preferably above the same threshold value of voltage of the other sensor electrode and the reference electrode, which can easily be evaluated in a downstream logic.

As the voltage signals of the sensor electrode based on the described configuration of the sensor electrodes are phase-shifted, this set of phases also affects the differences formed, so that from the output signals supplied by the comparators, the position of rotation of the rotary member relative to the coupling surface can be concluded. In the case of two comparators, a total of four different states can be differentiated so that—in a suitable configuration and design of the sensor electrodes and the reference electrode—respectively one quadrant-precise determination of position is possible. By monitoring the successive quadrants, the direction of rotation can then be detected.

According to the invention, it can be provided by the proposed method that an excitation pulse or a voltage pulse is generated applied to the excitation electrode by monitoring a switch in an electric circuit containing an inductor and connected to a battery, whereby the switch is opened when the charge current has reached a charge current threshold value.

After the switch is opened, due to the inductor in the electric circuit, first current continues to flow and thereby generates a voltage that is larger than the voltage supplied by the battery of the configuration. The voltage level is determined by the duration of the charge current and the charge current threshold value and can, according to the invention, be set in such a way that it reaches 10 to 15 times the level of the battery voltage. At a battery voltage of 3 V, the preferred voltage of the voltage pulse is approximately 30 to 35 V, which results in sufficient amplitude for the evaluation circuit. The chronological progression of the pulse is essentially sinus-shaped and its frequency is such that the evaluation comparator can capture this pulse. The frequency can also be configured by the frequency generator. Thereby, the position of the rotary member can be determined exactly.

In addition the charging lime from closing the switch up to reaching the charging current threshold value can be monitored. Hereby, the monitoring of manipulation that has already been described in connection with the configuration is achieved, which detects the attachment of an external magnetic field to the configuration that influences the charging time. If appropriate, it can be provided by the method according to the invention that the configuration emits a message in the event of a manipulation to a data collector that captures the consumption data, preferably by means of wireless communication. This can, for example, be realized thereby, that in the event of exceeding and/or not reaching a charging time that can be specified or is specified as limit value, an error signal is generated up to reaching the charging current threshold value (L).

Finally, the present invention also relates to a use of a configuration according of one of Claims 1 through 7 in a consumption meter, in particular a water, gas or electricity meter that has a rotatable consumption sensor with a coupling, in particular, a magnetic coupling, to which the rotatory member of the configuration according to one of Claims 1 through 7 can be coupled, whereby the meter has a processing unit for evaluating the rotational position of the rotary member that is supplied by the configuration, and for converting the consumption data. According to the invention, this processing unit can also be integrated into the configuration previously described. Further, the meter can also have a communication module for wireless transmission of the consumption data and/or of error messages, to the data collector, for example, in the event of a manipulation that was detected. The communication module can also be integrated into a module having the configuration according to the invention.

With the configuration according to the invention and the proposed method for capacitative sensing of the rotary motion of a rotary member, based on voltage pulses having a voltage in range of between 30 and 35 V that can be generated in a technically simple way, an enlargement of the signal/interference ratio and thereby a greater insensitiveness of the configuration with respect to EMC interference is achieved, such as it is generated, for example by lamp transformers.

In addition, the optimized geometry of the arrangement produces a very good modulation amplitude of the signals, so that by means of the microprocessor system, a robust, reliable evaluation of the sampled voltage signals can be realized.

Further, the possibility of detecting manipulation by an externally generated magnetic field is possible without any additional electronic members. This detection of manipulation is especially effective relative to frequently used manipulation attempts. To detect manipulation, the charge current curve of the inductor is evaluated. Hereby, an improperly high current drain from the battery would also be avoided, which would occur in such a case of manipulation, as the charge current of the inductor in the disturbed operating conditions is limited by the already specified charge current threshold value. Thereby, the period of use of the module, which depends on battery capacity, can also be ensured in the event of manipulations.

It is advantageous when the microprocessor system or the evaluation circuit of the configuration documents the time of entry and if appropriate, the time of removal of the manipulation by a stationary magnetic field that interferes with the operating conditions. This can be achieved thereby, that the time of the occurrence of the interference is stored with date and time in a non-volatile memory. Analogously, this takes place as soon as the faulty operating condition is no longer present. In this way, the duration of the interference is documented and can be read out by a service device, or transmitted via radiogram. This can be taken into consideration when invoicing the consumption costs.

Additional advantages, features and possibilities of use of the present invention also result from the following description of exemplary embodiments and the drawing. Thereby, all described and/or figuratively shown features by themselves or in any combination make up the subject-matter of the present invention, even independent of their summary in the claims or their references.

BRIEF DESCRIPTION OF THE DRAWINGS

Shown are.

DETAILED DESCRIPTION

Figure 1:
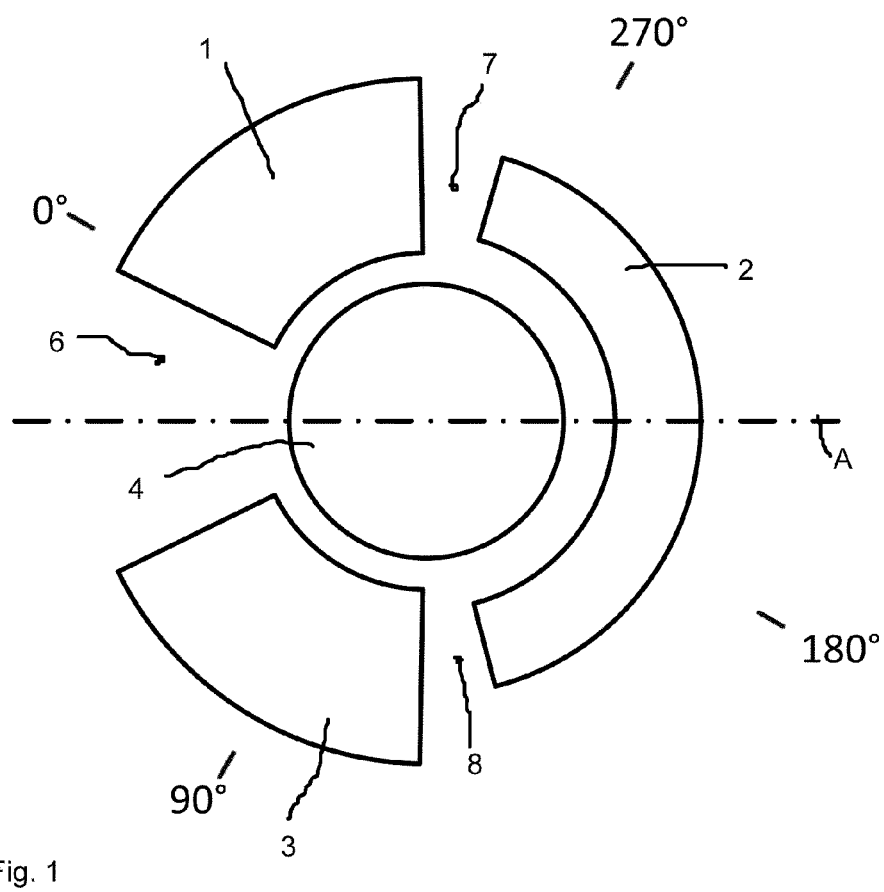
FIG. 1 schematically shows a configuration according to the invention with the sensor electrodes, the reference electrode and the backing electrode.
Figure 2:
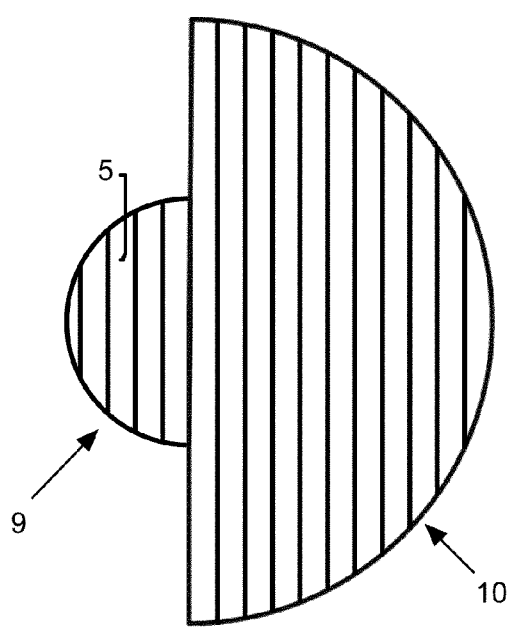
FIG. 2 shows the pertaining coupling surface of the rotary member.

FIG. 1 schematically shows the arrangement of the electrodes in the configuration according to the invention for capacitative sensing of the rotary motion of a rotary member. This configuration consists of a first sensor electrode 1, a reference electrode 2, a second sensor electrode 3 and an excitation electrode 4. Opposite to this electrode configuration shown in FIG. 1, a coupling surface 5 consisting of an electrically conducting material is located that is shown in FIG. 2, which is displaced over the electrode arrangement according to FIG. 1 upon a rotatory motion of the rotary member.

In a particularly preferred configuration to which the present invention is, however, not limited, excitation electrode 4 is structured circular, around which the remaining electrodes, i.e. the first and the second sensor electrode 1, 3 and the reference electrode 2 are located. The first and the second sensor electrode 1, 3 are designed identical and have the shape of a segment of a circle, whereby the center of the circle is in the center of excitation electrode 4. Sensor electrodes 1 and 3 thereby cover an angular segment of approximately 60° relative to a complete circle. Reference electrode 2 is also designed as segment of a circle, whereby the center of this circle is also at the center of excitation electrode 4. The angular field covered by reference electrode 2 extends, relative to the complete circle, approximately 145°.

Thereby, the depth of the reference electrode in radial direction is smaller than the depth of sensor electrodes 1, 3 in radial direction, whereby the sizes of electrodes 1, 2, 3 are preferably adapted in such a way that the voltage signals of first sensor electrode 1, second sensor electrode 3 and reference electrode 2 are within the same order of magnitude when in operation.

An intermediate space 6 that has no electrode surface is designed between first sensor electrode 1 and second sensor electrode 3. Intermediate space 6 approximately consists of an angular field of approximately 50°. The remaining angular field that is not covered by electrodes 1, 2, 3 around excitation electrode 4 is divided evenly into two additional intermediate spaces 7, 8 of equal size between the first sensor electrode 1 and reference electrode 2 or the second sensor electrode 3 and reference electrode 2. First sensor electrode 1, second sensor electrode 3 and reference electrode 2 essentially surround excitation electrode 4 circularly, whereby a distance between excitation electrode 4 and remaining electrodes 1, 2, 3 is also present in the radial direction for insulation.

Overall, the configuration of electrodes 1, 2, 3, 4 is constructed symmetric relative to an axis of symmetry A, which extends through the center of the round excitation electrode 4 and symmetrically divides intermediate space 6 between first sensor electrode 1 and second sensor electrode 3. On the—relative to excitation electrode 4—opposite side to intermediate space 6, the axis of symmetry A divides reference electrode 2 symmetrically. The entire configuration is designed in mirror image relative to axis of symmetry A.

Coupling surface 5 shown in FIG. 2 that is mounted on or attached to a rotary member—not shown—and located opposite to electrodes 1, 2, 3, 4, has an inner circular section 9 and an outer, semi-circular section 10 partially surrounding inner section 9. The circular, inner section 9 thereby merges into outer section 10 so that in the contour, only a semicircle can be seen of the circular inner section 9. Coupling surface 5 is designed consisting of a conducting material, in particular, a metallic material.

Figure 3A:
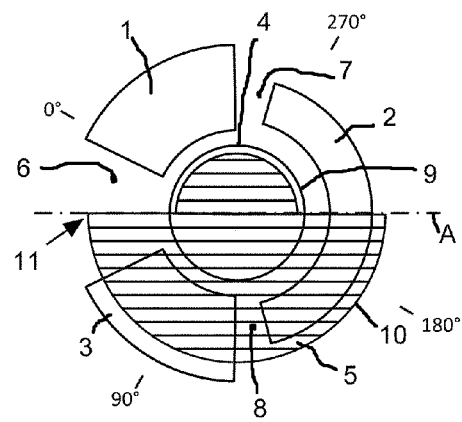
FIG. 3*a* shows a combined arrangement of the electrodes and the coupling surface in a first rotary position of the coupling surface.
Figure 3B:
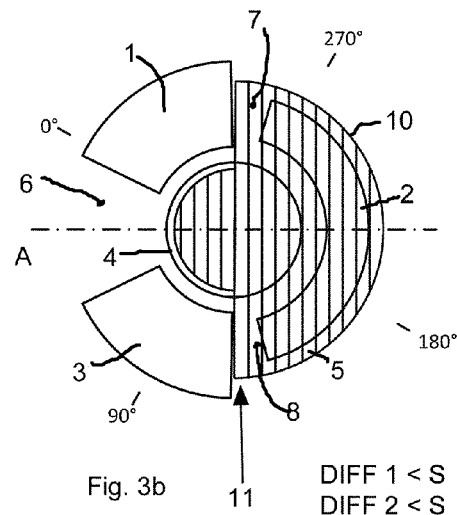
FIG. 3*b* shows a combined arrangement of the electrodes and the coupling surface in a second rotary position of the coupling surface rotated 90° relative to FIG. 3*a*.
Figure 3C:
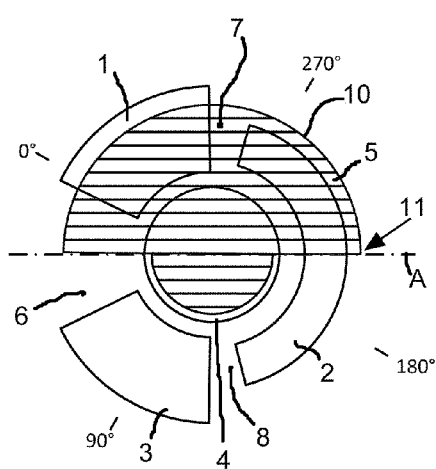
FIG. 3*c* shows a combined arrangement of the electrodes and the coupling surface in a third rotary position of the coupling surface rotated by 90° relative to FIG. 3*b*.
Figure 3D:
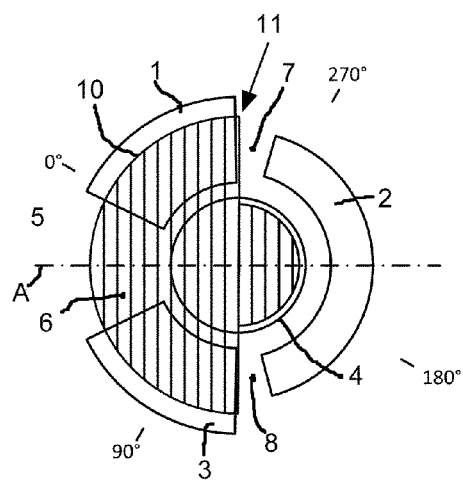
FIG. 3*d* shows a combined arrangement of the electrodes and the coupling surface in a fourth rotary position of the coupling surface rotated by 90° relative to FIG. 3*c*.

In FIGS. 3*a* through 3*d*, an installed condition of the configuration according to the invention with electrodes 1, 2, 3, 4 and coupling surface 5 is shown, whereby coupling surface 5 is shown transparent for the sake of clarity. In the illustration according to FIG. 3*a*, inner section 9 of coupling surface 5 essentially covers excitation electrode 4, whereby the radius of inner section 9 of coupling surface 5 is slightly smaller than the radius of excitation electrode 4. This covering applies, as is shown in FIG. 3*b* through 3*d*, to any rotary position of coupling surface 5 relative to electrodes 1, 2, 3, 4. For this, the axis of rotation of coupling surface 5 is in the center of the circle of the inner section of coupling surface 5, and in the center of circular excitation electrode 4.

Outer section 10 of coupling surface 5 covers second sensor electrode 3 in the rotary position according to FIG. 3*a*, the one half of reference electrode 2 following sensor electrode 2 and the intermediate space 8 formed between second sensor electrode 3 and reference electrode 2, and the one half of intermediate space 6 following first sensor electrode 3 between first sensor electrode 1 and second sensor electrode 3. In this position of rotation, a capacitative coupling of the excitation electrode 4 with second sensor electrode 3 and reference electrode 2 takes place via coupling surface 5.

In FIG. 3*b*, coupling surface 5 was rotated 90° to the left, i.e. counterclockwise compared to the rotary position in FIG. 3*a* so that coupling surface 5 covers reference electrode 2 and adjacent intermediate spaces 7, 8 with outer section 10.

In the illustration according to FIG. 3*c*, outer section 10 of coupling surface 5 covers first sensor electrode 1, the one half of reference electrode 2 following first sensor electrode 1, the intermediate space 7 formed between first sensor electrode 1 and reference electrode 2, and the one half of intermediate space 6 between first sensor electrode 1 and second sensor electrode 2 following sensor electrode 1. In this position, excitation electrode 4 couples capacitative with first sensor electrode 1 and reference electrode 2.

Finally, FIG. 3*d* shows a further rotation of coupling surface 5 by 90°, so that coupling surface 5 with its outer section 10 now covers first sensor electrode 1 and second sensor electrode 3 as well as the intermediate space 6 formed between first sensor electrode 1 and second sensor electrode 3. Thus, first sensor electrode 1 and second sensor electrode 3 are coupled capacitative.

As a result of the motion shown by quadrants in FIG. 3*a* through 3*d*, a complete rotation of coupling surface 5 with the rotary member over the configuration consisting of electrodes 1, 2, 3, 4 takes place, whereby the rotary positions after respectively 90° are shown as snapshots.

The term "covering" means that coupling surface 5 covers at least a part of the surfaces of first sensor electrode 1, second sensor electrode 3 or reference electrode 2 with its outer section 10, so that a strong capacitive coupling between the covered electrodes 1, 2, 3 and excitation electrode 4 takes place, whereby the latter excitation electrode 4 is always covered. A complete covering of the section of electrodes 1, 2, 3, 4 by coupling surface 5 is not absolutely necessary for covering as per the terminology used in this application.

Figure 4:
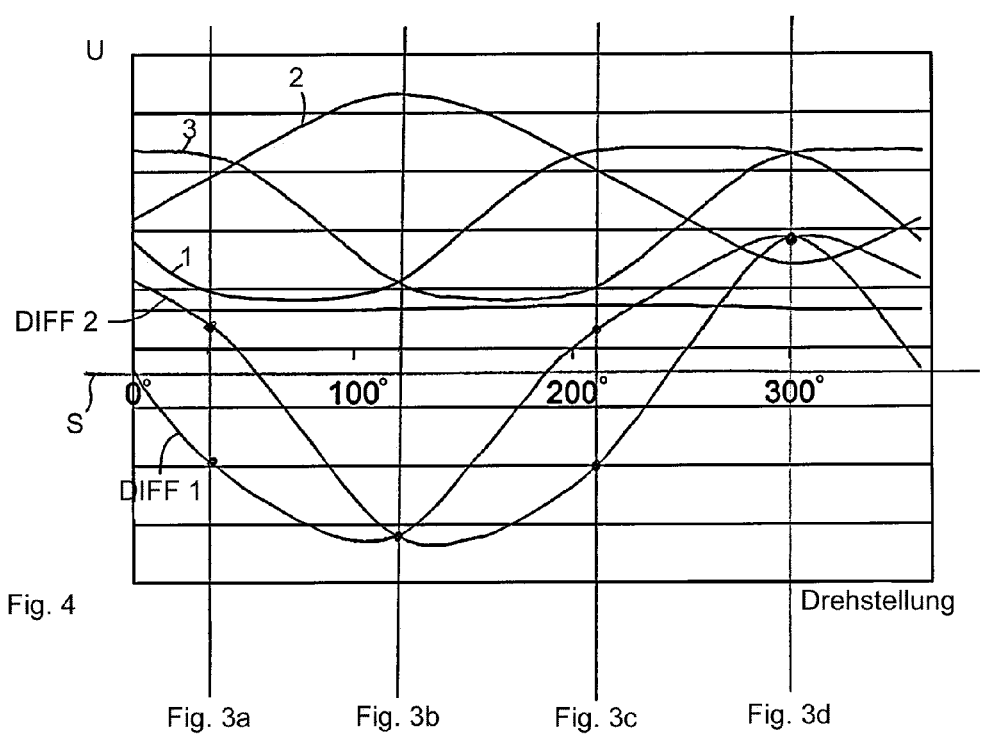
FIG. 4 shows a diagram with the voltage signals picked up at the sensor electrodes and the joint reference electrode and the difference signals created by such depending on the rotary position of the coupling surface.

If a voltage is applied to excitement electrode 4, a charge is induced by the capacitive coupling on coupling surface 5, which brings it about that electrode 1, 2, 3 that are respectively covered by coupling surface 5 depending on the position of rotation of coupling surface 5, are coupled capacitive with each other and a voltage signal can be detected at the various electrodes 1, 2, 3, the level of which varies depending on the rotary position of coupling surface 5. FIG. 4 shows the voltage curve U depending on the rotary position of coupling surface 5, whereby the rotary position is shown in degrees and the voltage in any units. The indicated angle is defined by tip 11 for measuring the angle of coupling surface 5 corresponding to the angularities drawn in FIG. 1 and FIG. 3a through 3d.

For the sake of simplicity, the voltage curves are described with the respective numbers of electrodes 1, 2, 3, at which the voltage is tapped. In the diagram, the positions according to FIG. 3a through FIG. 3d are drawn as perpendicular lines extending beyond the diagram and marked as corresponding to FIG. 3a through FIG. 3d. In the position according to FIG. 3a, second sensor electrode 3 is coupled with half of reference electrode 2. The voltage applied to second sensor electrode 3 is therefore close to the maximum value. Correspondingly, uncovered first sensor electrode 1 is close to its minimum value. Reference electrode 2, which is covered by half is approximately in the middle between the maximum and minimum voltage value.

In the position according to FIG. 3b, first sensor electrode 1 and second sensor electrode 3 are not covered in a symmetrical way, so that their voltage values are equal and comparatively low. The completely covered reference electrode 2 has its maximum value in this position.

FIG. 3c corresponds to the position according to FIG. 3a, whereby the values between first sensor electrode 1 and second sensor electrode 3 are precisely exchanged, as first sensor electrode 1 is covered by coupling surface 5 in this rotary position.

In the rotary position according to FIG. 3d, first sensor electrode 1 and second sensor electrode 3 are coupled capacitative by coupling surface 5. Their values are close to the maximum values and are identical. Reference electrode 2, which is not covered at all is at its maximum value in this rotary position.

As additional curves, the difference values formed according to the invention between first sensor electrode 1 and the reference electrode (labeled as DIFF 1) and the second difference between second sensor electrode 3 and the reference electrode (labeled as DIFF 2) have been drawn in.

It can easily be seen that the phase shift between the voltage curve of sensor electrode 1 and the voltage curve of second sensor electrode 3 is precisely 90° (relative to the rotary position of the coupling element). The voltage signal of reference electrode 2 is at a maximum when the voltage signals of first sensor electrode 1 and second sensor electrode 3 are equal in the proximity of their minimum voltage value. Correspondingly, the voltage signal of reference electrode 2 is minimal when the voltage values of first sensor electrode 1 and second sensor electrode 3 are equal in the proximity of their maximum value.

As a result of the difference formation of the voltage curve according to the invention of first sensor electrode 1 or second sensor electrode 3 respectively with reference electrode 2, when comparing the two differences formed DIFF 1 and DIFF 2 with a threshold value, information about the rotary position of coupling element 5 is obtained respectively. A suitable threshold is drawn as horizontal line S in FIG. 4. This line is approximately in the middle between the maximum value and the minimum value of the two difference curves DIFF 1 and DIFF 2. In the rotary position according to FIG. 3a, the value of DIFF 1<S and the value of DIFF 2>S. In the position according to FIG. 3b, both difference values DIFF 1, DIFF 2<S. In the rotary position according to FIG. 3c, the difference value DIFF 1>S and the difference value DIFF 2<S. In the rotary position according to FIG. 3d, however, both difference values DIFF 1 and DIFF 2>S. In FIG. 4, the respective function values are shown as dots on the lines intersecting the vertical lines indicating the rotary position. The comparison with the threshold values S is specified in the illustrations of FIG. 3a through FIG. 3d.

As can be seen clearly there, the four possible constellations of the difference values DIFF 1 and DIFF 2 compared with the threshold value S can be associated respectively to a rotary position of coupling surface 5 rotated by 90°, so that as a result of this analysis, the respective quadrant in which coupling surface 5 is located, can be determined precisely.

In order to be able to review the position of the rotary member with a frequency adapted to the standard metering progression, it is proposed according to the invention, to charge excitation electrode 4 with sufficient high-frequency voltage pulses so that for a maximum expected rotational frequency of the counter, at least one sampling takes place in each quadrant.

Figure 5:
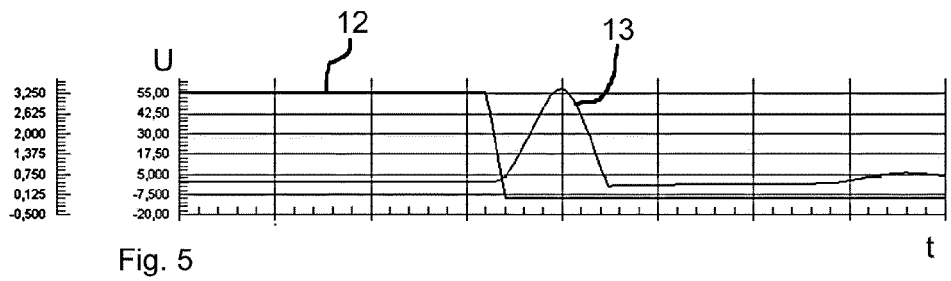
FIG. 5 shows a voltage time diagram with the curve of the battery voltage in the excitation circuit and the pulse peak at different scaling and any units.

As meters are often battery-operated devices and the nominal operating voltage supplied by the battery is too low to achieve a sufficiently precise pulse response with a simple electronic analysis, it is proposed according to the invention to generate voltage pulses in an electric current operated by battery 21 by using an inductor 22. For this, the battery current circuit is closed by a pulse generator or a frequency generator 24 at the desired pulse frequency, so that the battery voltage is applied to inductor 22. This leads to a charge current at inductor 22, whereby after opening the electric circuit because of the behavior of inductor 22, first electricity continues to flow and thereby a high voltage pulse 13 is generated for a short time. This is shown in FIG. 5, whereby when switch 23 is closed, the battery voltage 12 is preferably applied until a certain charge current is reached. Then, the electric circuit is opened which leads to a decrease in the battery voltage via inductor 22. Simultaneously, as a result of inductor 22, a voltage pulse 13 is generated with a voltage that has an approximately 10 to 15 times higher voltage than battery voltage 12. In FIG. 5, this is shown by the various voltage scales.

Voltage pulse 13 that is generated in this way is applied to excitation electrode 4 and transmitted via coupling element 5 to those electrodes 1, 2, 3 that are presently covered by coupling element 5.

Figure 6:
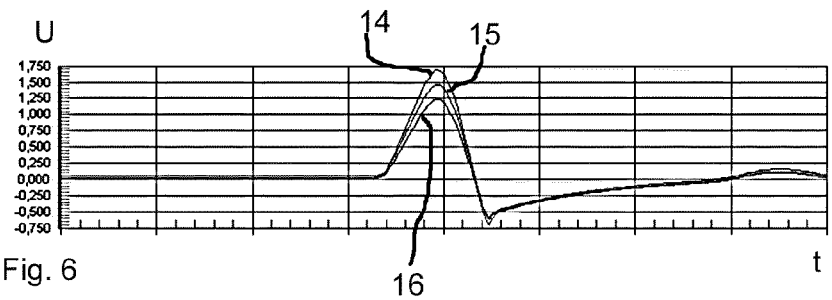
FIG. 6 shows a variation of the voltage signals of the sensor electrode with small, medium and high capacitative sensing depending on the position of the coupling surface in any units.

FIG. 6 shows a voltage signal that can be tapped at these electrodes 1, 2, 3 depending on whether coupling surface 5 achieves a strong, medium or weak capacitative coupling. The largest sensor voltage pulse 14 is tapped at a sensor or reference electrode 1, 2, 3 when capacitive coupling is at its maximum. In the case of medium capacitative coupling, the middle sensor voltage pulse 15, and in the case of only weak capacitative coupling, the low sensor voltage pulse 16 is detected at electrode 1, 2, 3.

Figure 7:
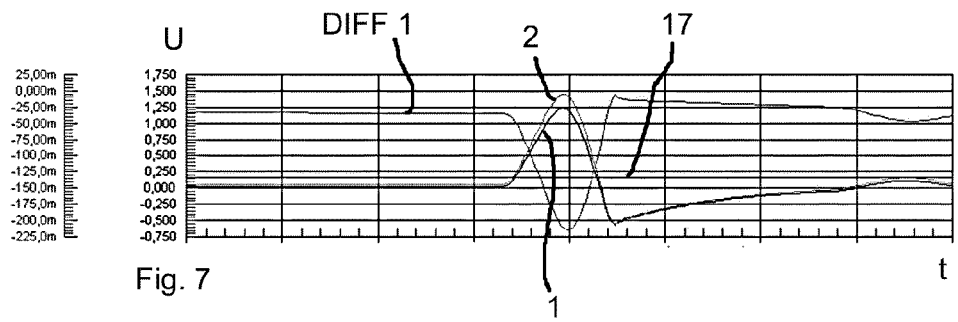
FIG. 7 shows a voltage time diagram with the voltage signals of the first sensor electrode and the reference electrode, the difference signal created by both signals and the output signal of the comparator that is generated depending on the value of the difference signal in various scaling and any units.
Figure 8:
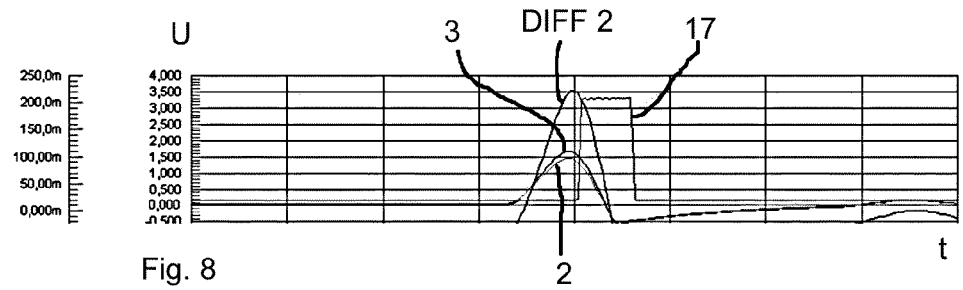
FIG. 8 shows a voltage time diagram with the voltage signals of the second sensor electrode and the reference electrode, the difference signal that is generated by the two signals and the output signal of the comparator generated depending on the value of the difference signal in various scaling and any units.

In FIGS. 7 and 8, the sensor signals of first sensor electrode 1 (FIG. 7) or second sensor electrode 3 (FIG. 8) and respectively those of reference electrode 2 are shown, whereby these are identified with the reference numbers associated with electrode 1, 2, 3 for the sake of simplicity. Further, a different scale shows the difference signal of the two voltage signals of sensor electrode 1, 3 and reference electrode 2, which is labeled as DIFF 1 or DIFF 2.

In FIG. 7, this signal in the voltage pulse is negative, because the voltage value of reference electrode 2 is larger than the voltage value of first sensor electrode 1. A comparator 26, which forms the difference of the two signals therefore only supplies output signal 17 with a value of 0. In FIG. 7, the difference signal DIFF 1 and the voltage signals of first sensor electrode 1, reference electrode 2 and output signal 17 respectively use different scaling.

This correspondingly applies to the illustration in FIG. 8, which shows the voltage signal of second sensor electrode 3 and the voltage signal of reference electrode 2. The difference DIFF 2 of these two signals is larger than 0, because voltage pulse of sensor electrode 3 is larger than the voltage value of reference electrode 2. This positive difference signal DIFF 2 initiates a comparator 27, which forms the difference DIFF 2 of the two voltage signals, to emit an output signal 18 that is not equal to 0.

Thus, in FIGS. 7 and 8, the value DIFF 1<S and the value DIFF 2>S. Correspondingly, coupling surface 5 is in a rotary position according to FIG. 3a.

Figure 9:
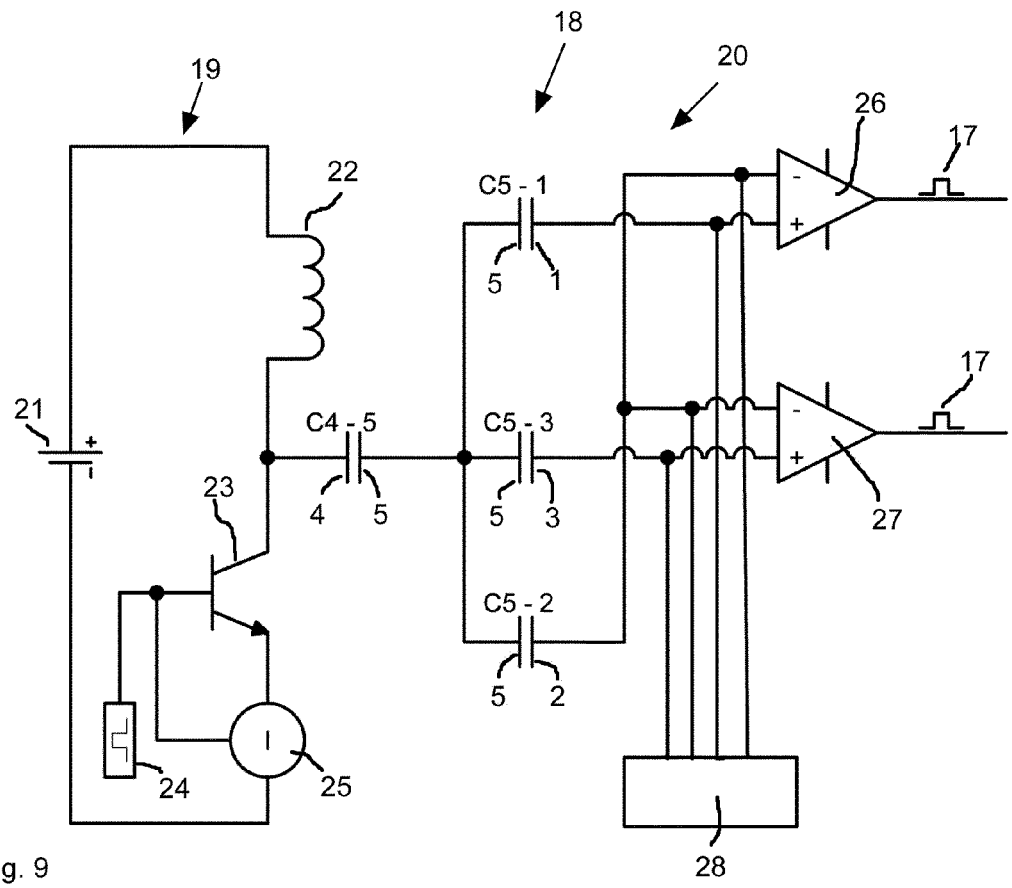
FIG. 9 shows a simplified diagram of the excitation circuit and the evaluation circuit according to the configuration according to the invention.

FIG. 9 schematically shows a logical circuit diagram of analysis unit 18 of the configuration according to the invention. Analysis unit 18 has an excitation circuit 19 for generating excitation pulses in the form of voltage pulses 13 and an evaluation circuit 20 for capturing voltage signals applied to electrodes 1, 2, 3 for comparing these voltage signals. In excitation circuit 19, battery 21 supplies the operating voltage in order to load an inductor 22 by means of a charge current when a switch 23 is closed by a frequency generator 24, which specifies the frequency of voltage pulses 13. When switch 23 is closed, an ammeter 25 measures the charge current of inductor 22 until it reaches a charge current threshold value L. Hereby, switch 23 is prompted to break the electric circuit. Subsequent to that, electricity continues to flow because of inductor 22, as a result of which a voltage pulse 13 is generated that is applied to excitement electrode 4.

Excitation electrode 4 is coupled capacitative with coupling surface 5 via inner section 9 of coupling surface 5, which in turn, depending on the rotary position, couples capacitative with first sensor electrode 1, second sensor electrode 3 or reference electrode 2. Hereby, a voltage value can be tapped respectively at first sensor electrode 1, at second sensor electrode 3 and at reference electrode 2 and conveyed to a first comparator 26 that forms the difference signal DIFF 1, and a second comparator 27, that forms difference signal DIFF 2. The threshold value S is set in the input leads to the first or second comparator 26, 27 by an operating point setting 28 that has, for example, suitable potentiometers in order to correspondingly shift the voltage levels that are supplied to the comparators 26, 27.

First comparator 26 and second comparator 27 emit output signal 17 in the manner described depending on the result of the difference formation, which is either 0 or not equal to 0. This output signal 17 is then consulted to identify the rotation, identify the position and to identify the direction of rotation of the rotary member.

Figure 10:
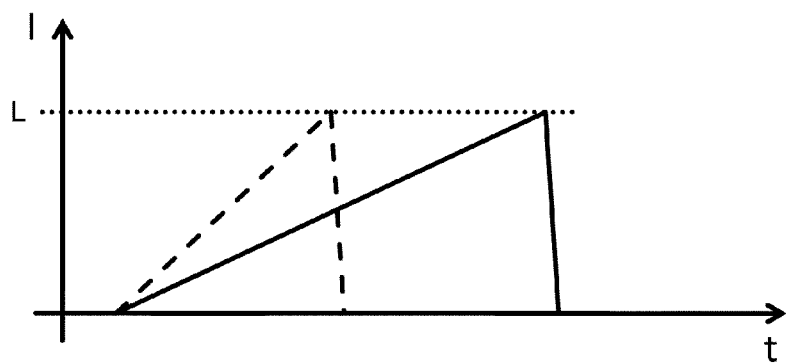
FIG. 10 shows a voltage time diagram of the charge current of the inductor for pulse generation.

FIG. 10 shows the behavior of the charge current in excitation circuit 19, when switch 23 is closed. As can be seen in the current curve in FIG. 10, the charge current rises during the charging process until the charge current threshold value L is measured by ammeter 25, and switch 23 is thereupon opened. The level of the excitation pulse 13 then, in particular, also depends on the capacity that is collected under the curve.

The determination of a charge current threshold value L as limit value for opening switch 23 has the advantage that no overloading of inductor 22 can occur.

As per an embodiment according to the invention, this charging mechanism can also be used to detect a manipulation of metering manipulations with an external magnetic field. Such a manipulation could bring it about, for example, that in a magnetic coupling of the rotary member of the configuration according to the invention, the magnetic coupling of a metering element measuring consumption slides through, and thus the metering is affected. For this reason, this is a frequently used manipulation in practice.

According to the invention, this type of manipulation can now be detected thereby, that the inductor 22 is changed by the external magnetic field. This leads to a faster rise in the charge current as shown in FIG. 10 by the dotted line. In this case, the charge current threshold value L is reached within a shorter time than in a standard charging as is indicated by the continuous line. By measuring the charge time up to reaching the charge current threshold value L it can therefore be decided if the entire sensor configuration is influenced by an external magnetic field.

This detection of manipulation can be performed particularly easily because no separate electronic components are required. The time from closing the switch up to reaching the charge current threshold value can, for example, be captured by a microprocessor that is already provided in the configuration.

REFERENCE NUMBERS

1 First sensor electrode
2 Reference electrode
3 Second sensor electrode
4 Excitation electrode
5 Coupling surface
6 Intermediate space
7 Intermediate space
8 Intermediate space
9 Inner section
10 Outer section
11 Tip for angle measurement
12 Battery voltage
13 Voltage pulse, excitation pulse
14 Large sensor voltage pulse
15 Medium sensor voltage pulse
16 Small sensor voltage pulse
17 Output signal
18 Analysis unit
19 Excitation circuit
20 Evaluation circuit
21 Battery
22 Inductor
23 Switch
24 Frequency generator
25 Device for current measurement, ammeter
26 First comparator 27 Second comparator
28 Operating point setting
A Axis of symmetry
S Threshold value
L Charge current threshold
DIFF1 Difference of the voltage signal between the first sensor electrode and the reference electrode
DIFF2 Difference of the voltage signal between the second sensor electrode and the reference electrode

What is claimed is:

1. A configuration for capacitive sensing of a rotary motion of a rotary member, the configuration comprising: one central excitation electrode, two sensor electrodes and one joint reference electrode located in one plane, an analysis unit connected to the central excitation electrode, the two sensor electrodes and the joint reference electrode, and an electrically conducting coupling surface, which is located at the rotary member opposite to the central excitation electrode, the two sensor electrodes and the joint reference electrode,
 wherein the central excitation electrode is, surrounded by the two sensor electrodes and the joint reference electrode,
 wherein the coupling surface is disposed in each rotary position opposite to the surface of the excitation electrode and covers part of the surfaces formed by the two sensor electrodes and the joint reference electrode and passes over the surfaces formed by the two sensor electrodes and the joint reference electrode during rotation of the rotary member, and
 wherein the analysis unit has an excitation circuit connected to the excitation electrode for generating excitation pulses having a specified frequency and an evaluation circuit connected to the two sensor electrodes and the joint reference electrode for capturing the voltage signals applied to the two sensor electrodes and the joint reference electrode and for comparing these voltage signals,
 wherein at least the joint reference electrode is designed different in shape with respect to the sensor electrodes resulting in an asymmetric arrangement, in which an angular field, relative to a central point of the excitation electrode, covered by the joint reference electrode is different from an angular field covered by one or by each of the two sensor electrodes, and
 wherein the evaluation circuit is designed such that one difference of the voltage signal is formed between one of the two sensor electrodes, respectively, and the one joint reference electrode.

2. The configuration as recited in claim 1, wherein an axis of symmetry is present for the central excitation electrode, the two sensor electrodes and the joint reference electrode relative to which the shape and position of the central excitation electrode, the two sensor electrodes and the joint reference electrode in their arrangement represent a mirror image.

3. The configuration as recited in claim 1, wherein the two sensor electrodes and the joint reference electrode surround the excitation electrode essentially circularly, wherein between the two sensor electrodes and between each sensor electrode and the joint reference electrode an intermediate space is present, respectively.

4. The configuration as recited in claim 3, wherein the joint reference electrode is dimensioned such that the coupling surface precisely covers the surface of the joint reference electrode in a defined rotatory position of the rotary member with the intermediate spaces adjacent to the joint reference electrode.

5. The configuration as recited in claim 1, wherein the excitation electrode is shaped circularly and the coupling surface is shaped circularly in an inner section and is shaped semi-circularly in an outer section that partially surrounds the inner section, and wherein the angular field covered by the joint reference electrode is approximately 140° to 150°, and wherein the angular field covered by each of the two sensor electrodes is approximately 50° to 70°.

6. The configuration as recited in claim 1, wherein the evaluation circuit has two comparators, which respectively form the difference between the voltage signal of the one or the other sensor electrode and the voltage signal of the joint reference electrode, wherein a comparator emits an output signal only for a difference value above an adjustable threshold value.

7. The configuration as recited in claim 1, wherein the excitation circuit has an electric circuit connected to an operating voltage of a battery, the electric circuit having an inductor, a switch and a device for current measurement, wherein the excitation circuit is equipped to close the switch of the electric current for charging the inductor with charge current and to again open the switch upon reaching a charge current threshold value for generating the excitation pulse, wherein the excitation circuit is further equipped to measure the charge time between the closing of the switch and attaining the charge current threshold value for monitoring manipulation.

8. A method for capacitive sensing of a rotatory motion and position of a rotary member with a configuration consisting of one central excitation electrode, one joint reference electrode and two sensor electrodes surrounding the central excitation electrode, wherein the excitation electrode, the joint reference electrode and the sensor electrodes are located in a plane and positioned opposite to a coupling surface provided at the rotary member, which coupling surface covers the excitation electrode and depending on the position of rotation, parts of the two sensor electrodes and the joint reference electrode for the capacitive coupling of the excitation electrode with the joint reference electrode and the two sensor electrodes, wherein at least the joint reference electrode is designed different in shape with respect to the sensor electrodes resulting in an asymmetric arrangement, in which an angular field, relative to a central point of the excitation electrode, covered by the joint reference electrode is different from an angular field covered by one or by each of the two sensor electrodes the method comprising:
 (a) the excitation electrode is charged with excitation pulses of a specified frequency, wherein
 (b) the voltages of the joint reference electrode, the one of the sensor electrodes and the other of the sensor electrodes are measured,
 (c) the differences in voltage of the one and the other of the sensor electrodes are formed, respectively, with the joint reference electrode, and
 (d) the differences in voltage are evaluated to determine the displacement and the position of rotation of the rotary member.

9. The method as recited in claim 8, wherein an output signal is generated in one comparator of an evaluation circuit, respectively, if the difference in voltage of the one of the sensor electrodes and the joint reference electrode is above a threshold value, and if the difference in of the voltage of the other of the sensor electrodes is above the same threshold value.

10. The method as recited in claim 8, wherein one excitation pulse being applied to the excitation electrode is generated by performing the following steps:
   (a) closing a switch that is connected to a battery in an electric circuit containing an inductor
   (b) monitoring a resulting charge current, and
   (c) opening the switch when the charge current reaches a charge current threshold value.

11. The method as recited in claim 10, wherein a charging time is monitored, wherein the charging time starts with closing the switch and stops with reaching the charge current threshold value.

12. The method as recited in claim 10, wherein an error signal is generated when a charging time limit value range for attaining the charge current threshold value is overrun or underrun, indicating a manipulation.

13. The method as recited in claim 12, wherein the charging time limit value range is preset.

\* \* \* \* \*